(12) United States Patent
Nishimura et al.

(10) Patent No.: US 10,483,557 B2
(45) Date of Patent: Nov. 19, 2019

(54) LAMINATE-TYPE POWER STORAGE ELEMENT AND CARD ELECTRONIC DEVICE

(71) Applicant: FDK CORPORATION, Tokyo (JP)

(72) Inventors: Naoaki Nishimura, Tokyo (JP); Daisuke Hirata, Tokyo (JP); Tetsuya Yamashita, Tokyo (JP); Akihiro Yamamoto, Tokyo (JP)

(73) Assignee: FDK Corporation, Tokyo (JP)

( * ) Notice: Subject to any disclaimer, the term of this patent is extended or adjusted under 35 U.S.C. 154(b) by 261 days.

(21) Appl. No.: 15/406,240

(22) Filed: Jan. 13, 2017

(65) Prior Publication Data

US 2017/0207465 A1    Jul. 20, 2017

(30) Foreign Application Priority Data

Jan. 15, 2016    (JP) .................................. 2016-006545
Jan. 12, 2017    (JP) .................................. 2017-003139

(51) Int. Cl.
*H01M 2/02* (2006.01)
*H01M 6/18* (2006.01)
*H05K 5/00* (2006.01)

(52) U.S. Cl.
CPC ........... *H01M 6/187* (2013.01); *H01M 2/021* (2013.01); *H05K 5/0086* (2013.01); *H05K 5/0091* (2013.01); *H01M 2220/30* (2013.01); *H01M 2300/0065* (2013.01)

(58) Field of Classification Search
None
See application file for complete search history.

(56) References Cited

U.S. PATENT DOCUMENTS

2007/0287063 A1* 12/2007 Hiratsuka .............. B21D 51/52
                                                        429/177

FOREIGN PATENT DOCUMENTS

JP    2004327046 A  * 11/2004
JP    2006-281613      10/2006

OTHER PUBLICATIONS

FDK Corporation, "Thin Type Primary Lithium Batteries," [online], searched on Dec. 9, 2015, Internet, http://www.fdk.com/battery/lithium_e/lithium_thin.html, in English.

* cited by examiner

*Primary Examiner* — Tracy M Dove
(74) *Attorney, Agent, or Firm* — Greer Burns & Crain Ltd.

(57) ABSTRACT

A laminate-type power storage element is configured of an exterior body that is formed in a flat bag shape by welding a first laminated film and a second laminated film by thermocompression bonding, and an electrode body that is sealed inside the exterior body, the electrode body having a sheet-shaped positive electrode and a sheet-shaped negative electrode. The first laminated film and the second laminated film respectively includes a first resin layer that has a property of transmitting a laser beam, a metal foil that is layered to the first resin layer, and a second resin layer is layered to the metal foil and has a thermal weldability.

4 Claims, 5 Drawing Sheets

LAMINATE-TYPE POWER STORAGE ELEMENT AND CARD ELECTRONIC DEVICE

CROSS-REFERENCE TO RELATED APPLICATIONS

The present application claims the benefit of priority pursuant to 35 U.S.C. § 119(a) to Japanese Patent Application No. 2016-6545 filed on Jan. 15, 2016 and Japanese Patent Application No. 2017-3139 filed on Jan. 12, 2017, the entire disclosure of which are herein incorporated by reference.

BACKGROUND

Technical Field

Embodiments of this disclosure generally relate to a laminate-type power storage element that houses a power generation element in an exterior body formed of laminated films and a card electronic device that incorporates the power storage element.

Related Art

Recently, an extremely thin electronic device (hereinafter, a thin electronic device) that incorporates a power supply, such as an IC card with a one-time password function and a display, an IC card with display, a tag, and a token (one-time password generator), has been put into practical use. To achieve these thin electronic devices, downsizing and thinning a power storage element (such as a primary battery, a secondary battery, and an electric double layer capacitor), which serves as a power supply, is necessary. As the power storage element appropriate for the downsizing and the thinning, there has been provided a laminate-type power storage element.

FIGS. 1A and 1B illustrate a laminated lithium primary battery as a conventional example for the laminate-type power storage element. FIG. 1A is an external view of a laminate-type power storage element 1a, and FIG. 1B is an exploded perspective view illustrating an internal structure of this power storage element 1a. As illustrated in FIG. 1A, the laminate-type power storage element 1a has a flat plate-shaped appearance. An exterior body 11 formed of laminated films shaped into a flat rectangular bag internally seals a power generating element. In the laminate-type power storage element 1a illustrated here, a positive electrode terminal plate 24 and a negative electrode terminal plate 34 are guided outside from one side of the rectangular exterior body 11.

Next, the following describes a structure of the laminate-type power storage element 1a with reference to FIG. 1B. FIG. 1B hatches proper positions as necessary for easy distinction of members and portions. The exterior body 11 internally seals an electrode body 10 together with an electrolytic solution. The electrode body 10 is formed by press-bonding a sheet-shaped positive electrode 20 and a sheet-shaped negative electrode 30 laminated via a separator 40. The positive electrode 20 is formed by applying a slurry positive electrode material 22 containing a positive-electrode active material such as a manganese dioxide over one principal surface of a positive electrode current collector 21 made of a metal foil or a similar material and drying the one principal surface. The positive electrode material 22 is applied over a surface of the positive electrode current collector 21 on a side opposed to the separator 40. In this example, a rectangular convex portion 23 is formed integrally with the positive electrode current collector 21. A distal end of this convex portion 23 is exposed outside of the exterior body 11 and forms the positive electrode terminal plate 24. Needless to say, a separate strip-shaped metal plate and a metal foil may be mounted to the positive electrode current collector 21, and the metal plate and the metal foil may be configured as the positive electrode terminal plate 24.

Meanwhile, the negative electrode 30 employs a flat plate-shaped metal lithium or lithium metal (hereinafter, a negative electrode lithium 32) as a negative-electrode active material. This negative electrode lithium 32 is press-bonded to a negative electrode current collector 31 formed of a metal foil, which is formed integrally with a rectangular convex portion 33. A distal end of the convex portion 33 of the negative electrode current collector 31 is configured as the negative electrode terminal plate 34. Needless to say, the negative electrode terminal plate 34 can also be configured separate from the negative electrode current collector 31.

The exterior body 11 is formed by welding peripheral edge regions 12 of two rectangular laminated films (11a and 11b) stacked on one another by the thermocompression bonding method to seal an inside of the laminated films 11a and 11b. As is well-known, the laminated films (11a and 11b) have a structure where resin layers are laminated on front and back of a metal foil (aluminum foil, stainless steel foil) serving as a base material. Generally, the laminated films (11a and 11b) have a structure where a first resin layer (hereinafter, a protection layer) made of, for example, a polyamide resin laminated on one surface and a second resin layer with thermal weldability (hereinafter, an adhesive layer) made of, for example, a polypropylene laminated on the other surface. The protection layer and the adhesive layer are possibly constituted of the single resin layer made of one resin material. Alternatively, the protection layer and the adhesive layer are each possibly additionally constituted of a plurality of resin layers. The protection layers in the laminated films (11a and 11b) face outside of the laminate-type power storage element 1a with respect to the metal foil and, for example, have a function of protecting the laminate-type power storage element 1a from an external environment (such as ultraviolet rays, temperature, and humidity). The adhesive layers, which are disposed on inner sides of the exterior body 11, bond the mutual two laminated films (11a and 11b) together by laminating the two laminated films (11a and 11b) and melting the laminated films (11a and 11b) during the thermocompression bonding.

With the laminate-type power storage element shipped as a product, after an electrode body is sealed inside an exterior body and the assembly is completed, information on the product (hereinafter, a label), such as polarity signs of + and −, a product name, a lot number, a serial number, and a date of manufacturing is printed on the surface of the exterior body. Alternatively, a paper or a similar medium on which the label has been printed is pasted. FIG. 1A illustrates the example where the label is printed directly on the surface of the exterior body 11 using an industrial inkjet printer. For example, the following Japanese Unexamined Patent Application Publication No. 2006-281613 also discloses the structure of the laminate-type power storage element and a similar specification. Non-Patent Literature (FDK CORPORATION, "Thin Type Primary Lithium Batteries," [online], [searched on Dec. 9, 2015], Internet <URL: http://www.fdk.co.jp/battery/lithium/lithium_thin.html> (<URL: http://www.fdk.com/battery/lithium_e/lithiun_thin.html> in English)) describes features, discharge performance, and a similar specification of the thin lithium batteries, actually commercially available laminate-type power storage elements.

As described above, as the label disposed on the exterior body of the laminate-type power storage element, a printed matter (hereinafter also referred to as a print label), a matter printed on a paper or a similar medium and pasted (hereinafter also referred to as a label seal), and a similar label are available. The lot number, the serial number, or the date of manufacturing included in the label is also the information to individually manage qualities of the laminate-type power storage elements as the products. These information included in the label are used to identify a cause of a failure and to recover the individual body with failure in case of some sort of failure in the product.

However, it has been found that the conventional laminate-type power storage element has a problem in deterioration of a display quality of the label, resulting in failing to recognize the information shown in the label. As the cause of the deterioration in the label, the following is given first. For example, in the case where the laminate-type power storage element is incorporated into an electronic device, the label is in contact with a circuit component, a casing of the electronic device, or a similar component. This causes the ink to be faint and patchy and the pasted label seal to peel off.

With the well-known IC card (such as a credit card), regardless of presence/absence of a built-in power supply, the thickness is specified to 0.76 mm in accordance with standard. With the use of the laminate-type power storage element as the power supply for the card electronic device such as the IC card, the label seal pasted on the surface of the exterior body thickens the exterior body at the pasted part; therefore, the label seal is unsuitable for an application to the incorporation into the card electronic device. Accordingly, the print label is used for the laminate-type power storage element incorporated into the card electronic device and further the laminate-type power storage element itself is designed to be extremely thin. For example, the laminate-type power storage element (thin lithium battery) disclosed in the Non-Patent Literature has an extremely thin thickness of around 0.4 mm.

However, the following has been proved recently. The use of the laminate-type power storage element with the print label as the power supply for the card electronic device causes a problem different from the faint and patchy of ink, the peeling of the label seal, or a similar problem caused by the structure of the card electronic device. Specifically, the card electronic device has a structure in which two film-shaped plastic plates are pasted together with adhesive. The two plastic plates sandwich the electronic circuit and the laminate-type power storage element. That is, with the card electronic device, when the two plastic plates are mutually pasted together with the adhesive in the manufacturing process, also bonding the electronic circuit and the laminate-type power storage element on the back surfaces of the plastic plates integrates the members as a single card electronic device. Therefore, in case of some sort of failure in the card electronic device, peeling off the pasted two plastic plates to identify the cause of the failure possibly peels off the print label together with the adhesive. Additionally, a solvent contained in the adhesive melts the ink forming the label, possibly blotting a character and a sign on the label. There is also a possibility that the melted ink attaches to the electronic circuit, causing an operational failure of the electronic device. If the melted ink is blotted from the back surface of the plastic plate and reaches the front surface, the appearance of the card electronic device is significantly damaged.

It is therefore an object of the present invention is to provide a laminate-type power storage element where a display quality of a label is not deteriorated due to friction and by a medical product such as a solvent and to especially provide a laminate-type power storage element suitable for a power supply for a card electronic device and a card electronic device incorporating the power storage element.

SUMMARY

Disclosed embodiments describe a laminate-type power storage element including an exterior body that is formed in a flat bag shape by welding a first laminated film and a second laminated film by thermocompression bonding, and an electrode body that is sealed inside the exterior body, the electrode body having a sheet-shaped positive electrode and a sheet-shaped negative electrode, wherein the first laminated film and the second laminated film respectively includes a first resin layer that has a property of transmitting a laser beam, a metal foil that is layered to the first resin layer, and a second resin layer that is layered to the metal foil and has a thermal weldability, the exterior body is configured by each of the second resin layers being made to oppose each other, the metal foil has a label formed by laser marking on a side of a boundary surface between the first resin layer, and the label is formed at a region where the first laminated film and the second laminated film are welded.

The following laminate-type power storage element can be configured. The exterior body is configured by welding peripheral edges of the first laminated film and the second laminated film. And the label is formed at a region on the peripheral edge.

The following is significantly effective. The laminate-type power storage element is incorporated into a card electronic device. The card electronic device is configured by pasting two resin films together with adhesive.

The following card electronic device also falls within the scope of the present invention. A card electronic device including an exterior body configured by pasting two resin films together with adhesive, an electronic circuit incorporated in the exterior body, and a power supply incorporated in the exterior body, wherein the aforementioned laminate-type power storage element is used as the power supply.

With the laminate-type power storage element of the present invention, a display quality of the label is not deteriorated due to friction and by a medical product such as a solvent. The card electronic device using this laminate-type power storage element averts an operational failure caused by the deterioration in the display quality of the label; therefore, the appearance is not damaged.

BRIEF DESCRIPTION OF THE DRAWINGS

For a more complete understanding of the present invention and the advantages thereof, reference is now made to the following description taken in conjunction with the accompanying drawings wherein.

DESCRIPTION OF EXEMPLARY EMBODIMENTS

Figure 1A:
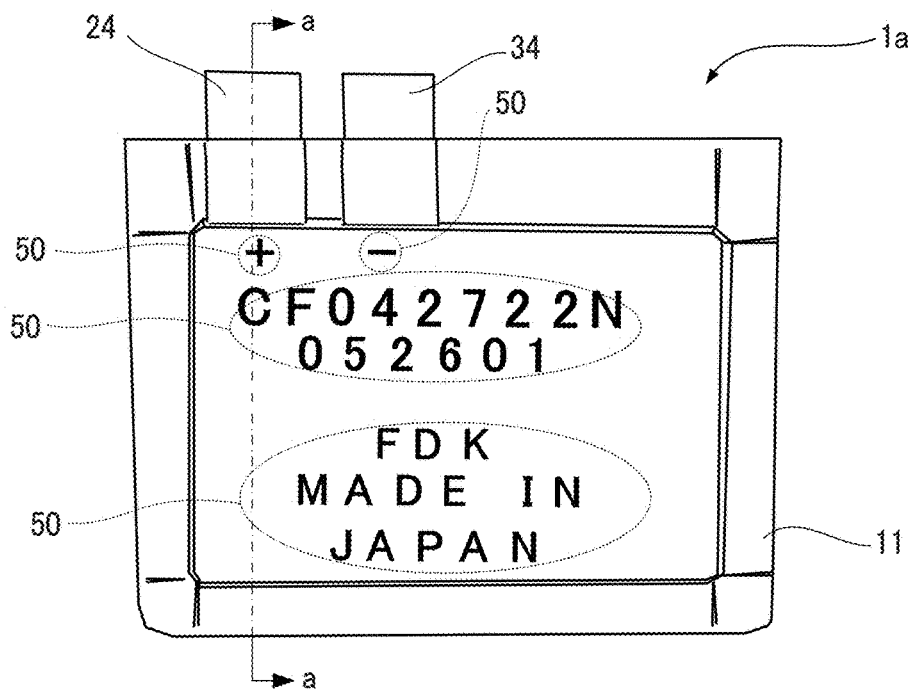
FIGS. 1A and 1B are drawings illustrating a structure of a general laminate-type power storage element.

The following describes working examples of the present invention with reference to the attached drawings. Like reference numerals designate corresponding or identical elements in the drawings used for the following description, and therefore such elements may not be further elaborated. While a reference numeral is assigned to a part in a drawing, if unnecessary, the reference numeral may not be assigned to the corresponding part in another drawing.

WORKING EXAMPLES

Label

Figure 1B:
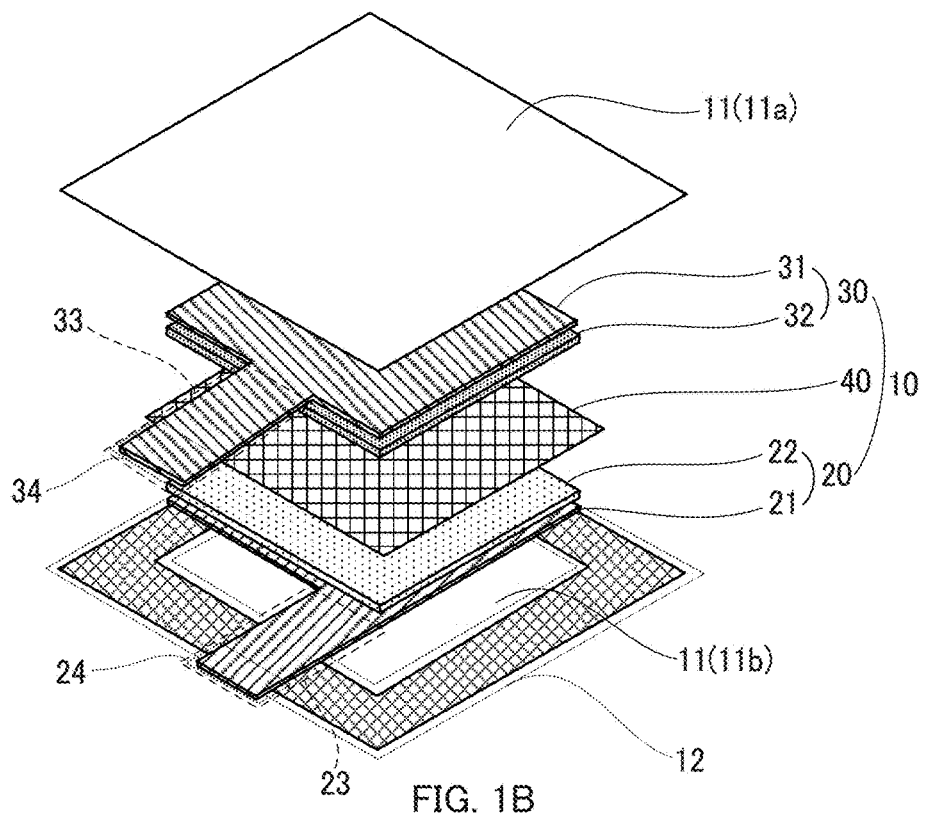
Figure 2A:
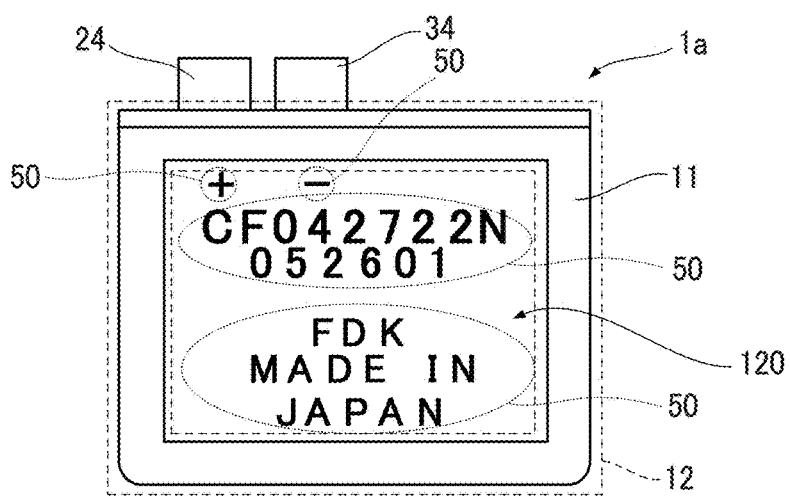
FIGS. 2A to 2C are drawings illustrating formation positions of labels in laminate-type power storage elements according to a conventional example and working examples of the present invention.
Figure 2B:
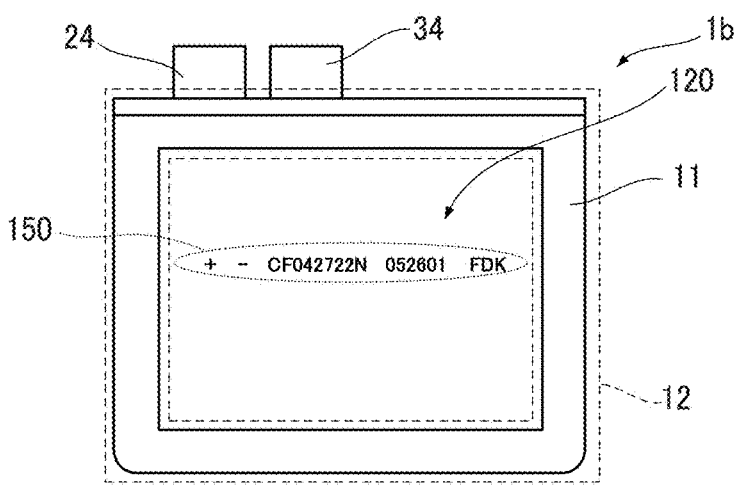
Figure 2C:
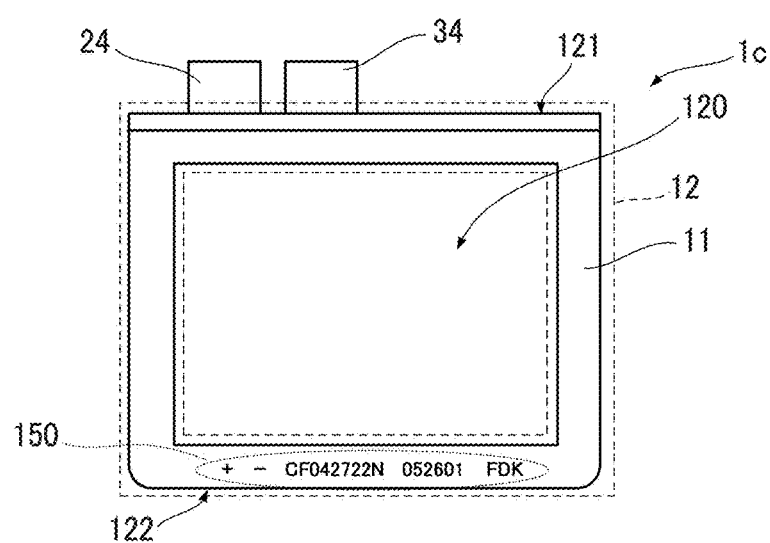

A shape and a structure of a laminate-type power storage element according to the working examples of the present invention are similar to the conventional laminate-type power storage element illustrated in FIGS. 1A and 1B. However, a label marked on an exterior body is engraved using a laser beam (hereinafter, a laser marking). FIGS. 2A to 2C illustrate formation states of a label in a laminate-type power storage element (hereinafter, a power storage element) according to a conventional example and labels in the power storage elements according to the working examples of the present invention. FIG. 2A is identical to a power storage element 1a according to the conventional example illustrated in FIGS. 1A and 1B. A label 50 is formed with ink in a region (hereinafter, a central region 120) where an electrode body is housed in an exterior body 11. FIG. 2B illustrates a power storage element 1b according to a first working example of the present invention. A laser-marked label (hereinafter also referred to as an engraved label 150) is formed in the central region 120 in the exterior body 11. FIG. 2C illustrates a power storage element 1c according to a second working example. The engraved label 150 is formed on a peripheral edge region 12 at which laminated films are mutually welded by thermocompression bonding in the exterior body 11. In this example, the engraved label 150 is formed on a margin 122 side, which is opposed to a margin 121 from which the electrode terminal plates (24 and 34) project, in the peripheral edge region 12 in the exterior body 11. The power storage element 1a according to the conventional example is a power storage element described as a product in the Non-Patent Literature (FDK CORPORATION, CF0422N). Configurations of the power storage elements (1b and 1c) except for the labels according to the first and the second working examples are identical to this product.

Laser Engraving

Figure 3A:
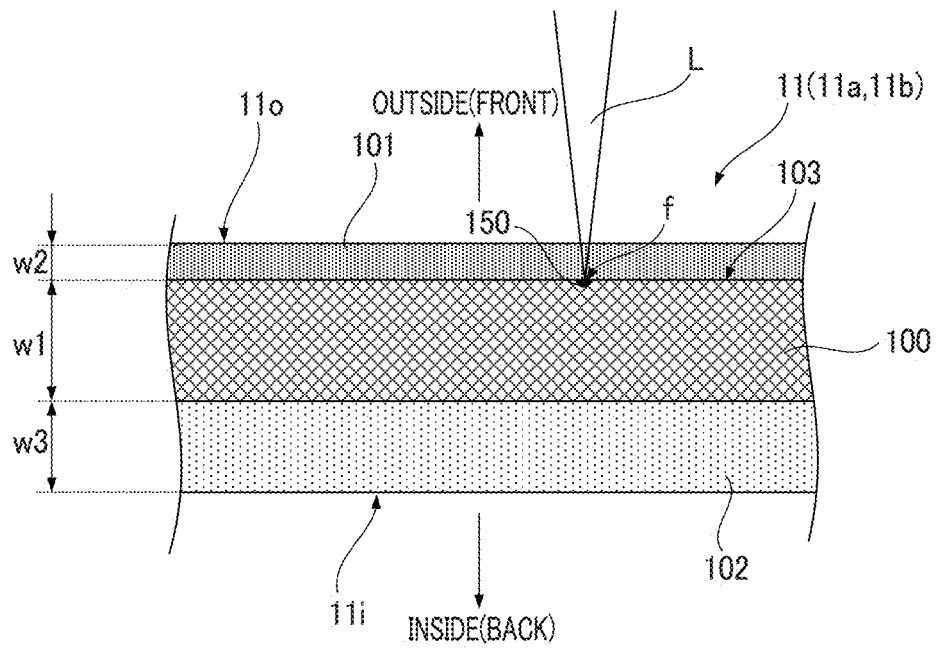
FIGS. 3A and 3B are drawings illustrating a formation method of the label in the laminate-type power storage element according to the working example and a formation state of the label.
Figure 3B:
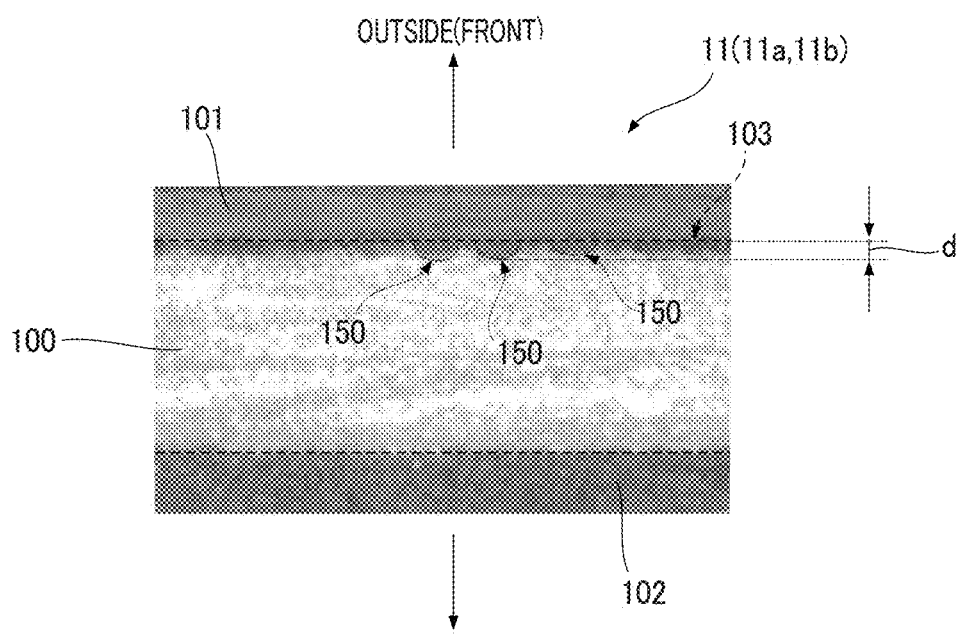

The following describes a method to perform the laser marking on laminated films of the exterior body. FIGS. 3A and 3B are drawings illustrating cross-sectional structures of the laminated films (11a and 11b) constituting the exterior body 11 of the power storage elements (1b and 1c) according to the first and the second working examples illustrated in FIGS. 2B and 2C. With the power storage elements (1a to 1c) according to the conventional example and the respective working examples, the exterior body 11 formed of the aluminum laminated films (11a and 11b) using an aluminum foil as a base material is laser marked. FIG. 3A is a drawing illustrating the cross-sectional structure of the laminated films (11a and 11b) and an irradiation state of a laser beam L in the laser marking. FIG. 3B is a photomicrography showing a cross section of the actually laser-marked portion 150 in the laminated films (11a and 11b). The drawing illustrates boundaries (101-100 and 100-102) between a layer of an aluminum foil 100 and layers (101 and 102) laminated on the layer of the aluminum foil layer 100 by dashed lines. As illustrated in FIG. 3A, the following structure is employed. The laminated films (11a and 11b) use the aluminum foil 100 with a thickness w1=40 μm as a base material. A protection layer 101 with a thickness w2=12 μm is formed on a surface (hereinafter, a front surface 11o) on the external side of the power storage element. An adhesive layer 102 with a thickness w3=30 μm is formed on a surface (hereinafter, an inner surface 11i or a back surface 11i) on the inner side of the power storage element. The protection layer 101 is, for example, colorless and transparent and has a property of transmitting the laser beam L irradiated from outside. The laser beam L is irradiated to a front surface 103 position on the aluminum foil 100 focused on a focal point f. The engraved labels 150 are formed on the front surface 103 side of this aluminum foil 100 without damaging the protection layer 101. A well-known laser engraving device (laser marker) is used for the laser marking. The laser marker using $YVO_4$ laser, carbonic acid gas laser, fiber laser, or a similar laser is well-known. Here, a laser marker using the $YVO_4$ laser at a wavelength of 1064 nm, the laser marking was performed by irradiating the laser beam L at an output of 10 W, a pulse frequency of 40 KHz, and a focal length from a light source of −60 mm. As illustrated in FIG. 3B, the power storage element according to the working example forms the engraved labels 150 with a depth d=2 to 3 μm on the front surface 103 side of the aluminum foil 100.

Performance Evaluation

Chemical Resistance of Label

First, the chemical resistance performance was confirmed on the engraved labels formed as described above. The various power storage elements 1a to 1c illustrated in FIGS. 2A to 2C were manufactured as samples A to C. Water, ethanol, xylene, and acetone were blotted into labels on the respective samples A to C with cotton swabs, and the labels were wiped off with the cotton swabs for conducting a chemical resistance test. Display states of the labels after the test were visually checked.

The following TABLE 1 shows results of the chemical resistance test.

TABLE 1

| | | LABEL | CHEMICAL RESISTANCE PERFORMANCE | | | |
|---|---|---|---|---|---|---|
| SAMPLE | METHOD | FORMATION AREA | WATER | ETHANOL | XYLENE | ACETONE |
| A | INKJET | CENTER | GOOD | POOR | POOR | POOR |
| B | LASER | CENTER | GOOD | GOOD | GOOD | GOOD |
| C | LASER | PERIPHERAL EDGE | GOOD | GOOD | GOOD | GOOD |

As for the samples A, B, and C corresponding to the various power storage elements 1a, 1b, and 1c, which are illustrated in FIGS. 2A, 2B, and 2C, respectively, TABLE 1 shows the case where some sort of deterioration in display quality, such as the blotting of the label, was recognized after the chemical resistance test as Poor and the case where the deterioration was not observed as Good. The deterioration of display was recognized on the label for the sample A using the ink with respect to various medical products (solvents) other than water. The deterioration of display was not recognized on the laser-marked labels for the sample B and the sample C with respect to all medical products.

Reliability in Power Storage Element

As described above, the sample B and the sample C, which correspond to the power storage elements according to the working examples of the present invention, include the engraved labels formed using the laser marking technology, thereby providing excellent chemical resistance performance. That is, unlike the label using ink, ink is not theoretically dissolved. Additionally, the engraved label is formed on the front surface of the metal foil in the laminated films; therefore, the protection layer covers the engraved labels. This avoids the label to be faint and patchy even if the surface of the protection layer is rubbed. Needless to say, the label is never peeled off when the power storage element incorporated into the IC card is taken out. Meanwhile, the performance of the power storage element itself by performing the laser marking is unknown. For example, although the laser beam is irradiated focused on the surface of the metal foil of the laminated films, the laser beam always transmits the protection layer. Unless transmissivity of the laser beam through the protection layer is 100%, a possibility of generating pinholes or similar holes in the protection layer cannot be completely eliminated. The pinholes when created in the protection layer corrode the metal, the base material of the lamination, by water vapor in the air. Further, the water vapor invades inside the exterior body, possibly increasing an internal resistance. Therefore, the reliability test on storing of the power storage elements with configurations identical to the respective samples A to C shown in TABLE 1 under a high-temperature, high-humidity environment, 60° C. and 90% RH, was conducted. A relationship between the number of days elapsed and the internal resistance after starting the test was examined. Specifically, five pieces of individuals of the respective samples A to C were manufactured. The internal resistances of the power storage elements of the individuals were each measured by a well-known AC constant-current method (1 KHz, 10 mA) to obtain average values of the internal resistances of the respective individuals depending on the samples.

Figure 4:
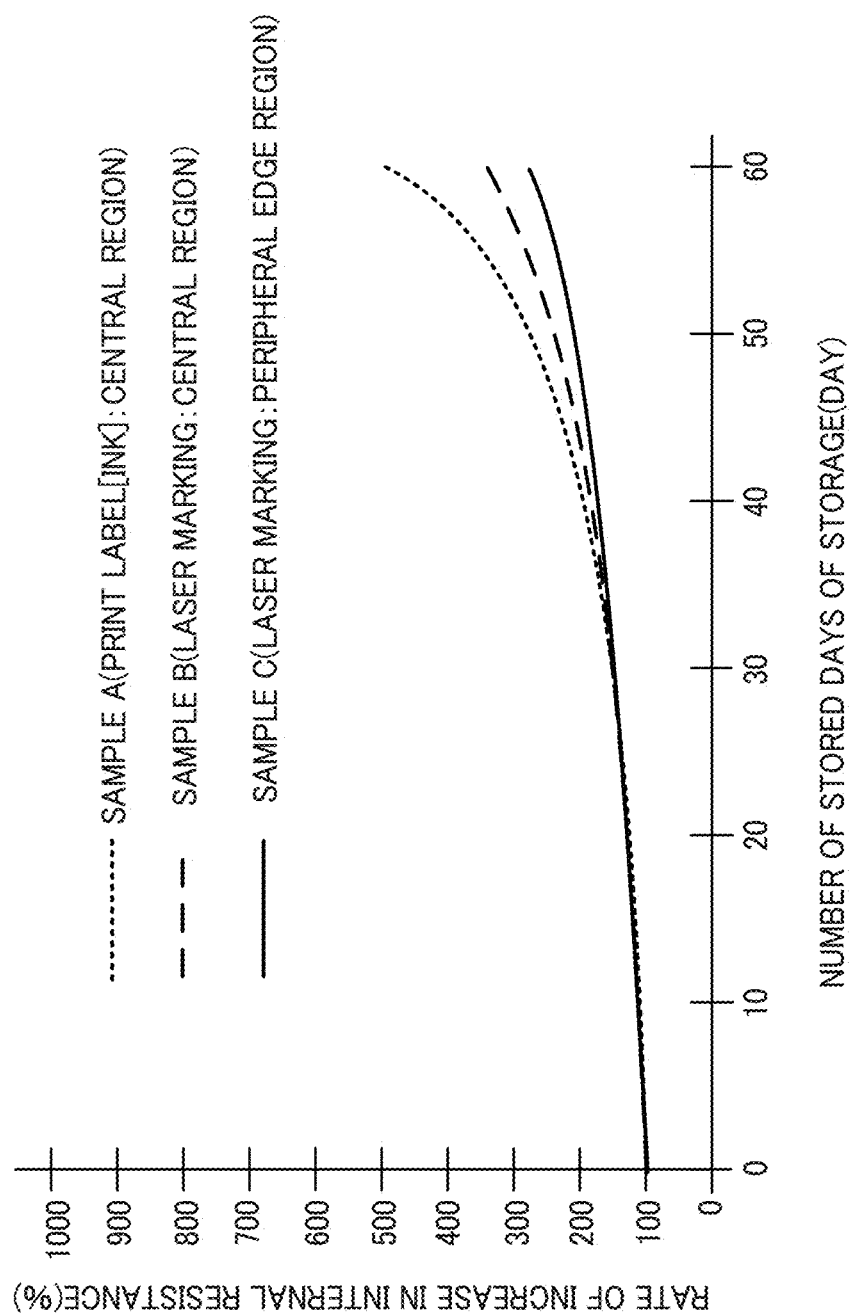
FIG. 4 is a drawing illustrating results of a reliability test on the laminate-type power storage elements according to the working examples.

FIG. 4 illustrates results of the reliability test. As illustrated in the drawing, the internal resistance of the sample A, which corresponds to the conventional power storage element, increased up to around 500% after the storage of 60 days compared with that in the beginning. As apparent from the fact that the sample A is practically provided as the commercial product, the increase in internal resistance itself to this extent does not practically cause a problem. Meanwhile, the sample B that included the engraved label by laser marking at the central region exhibited a rate of increase in internal resistance of around 350% after the storage of 60 days, and sample C that included the engraved label on the peripheral edge region exhibited the rate of increase in internal resistance of around 240%. This allowed to confirm the reliability to be higher than the sample A of the conventional example.

According to the test results illustrated in FIG. 4, in the samples B and C, which included the labels formed by the laser marking, the sample C, which included the engraved label on the peripheral edge region, had the reliability higher than the sample B, which included the engraved label on the central region. This is probably caused by flatness at the formation position of the engraved label. That is, the flatness of the central region where the electrode body is housed is lower than the flatness of the peripheral edge region where the thermocompression bonding is performed on the two mutual laminated films. Accordingly, there may be a portion in the sample B where a focal position (reference numeralf in FIG. 3A) of the laser beam is displaced to the protection layer side or is displaced to a position deeper than the front surface (reference numeral 103 in FIGS. 3A and 3B) of the metal foil. At the part where the focal point is displaced, the laser marking is performed on an interface between the protection layer and the metal foil and the deeper position of the metal foil, possibly thinning the protection layer and the metal layer. Meanwhile, it is considered that, the focal point can be precisely focused across the whole region of the engraved region for the label at the peripheral edge region with the sufficient flatness.

Although the print label was formed on the protection layer, the sample A, which was the conventional example, had a lower reliability compared with the sample B. This can be considered due to the property of the ink itself. Unlike the medium such as the paper, the laminated films are printing media of poor fixity of ink. Since the label is printed on the laminated film, an industrial inkjet printer that employs the laminated films as the printing medium often uses quick-drying ink containing solvent. The solvent possibly gives some sort of negative effect to the protection layer. To form the label, use of a thermal printer, which transfers ink, is considered to avoid degeneration of the protection layer caused by the solvent. However, since a print head is pressed against the central region where the electrode body is housed, this possibly damages the electrode body due to heat and pressure during the transfer of ink. Anyway, it has been found that, due to some sort of cause, the samples B and C that included the labels formed by the laser marking exhibited higher reliability than the sample A where the print label was formed. It has been also found that, even if the engraved label is formed by the laser marking, the formation regions of the label produce a difference in superiority or inferiority of reliability in the power storage element itself between the region where the laminated films are mutually welded and the region other than the welded region.

Moreover, improvement in reliability against the external environment was confirmed.

OTHER WORKING EXAMPLES

Although the working examples laser-mark the label on the exterior body using the aluminum laminated film, needless to say, the base material for the laminated films is not limited to the aluminum foil. It is only necessary that the base material be the metal foil on which the laser marking can be performed, such as stainless steel foil and copper foil. Obviously, an oscillation method of the laser beam ($YVO_4$ laser, carbonic acid gas laser, fiber laser, and a similar laser), the wavelength, the output, a pulse frequency, and a similar specification of the laser beam used for the laser marking can be appropriately set by the configuration of the laminated films (thicknesses and materials of the base material, the protection layer, and the adhesive layer).

In the above working example, the power storage element in which the label was laser marked on the peripheral edge region of the exterior body exhibited higher reliability than the label laser-marked on the central region of the exterior body. However, this is not limited to the peripheral edge region. It is considered that, as long as the label is laser marked on the region at which the thermocompression bonding is performed on the laminated films opposed to one another to weld the laminated films, the power storage element can similarly obtain the high reliability. For example, the following configuration is considered to ensure a similar high reliability. A hole penetrating in a lamination direction is disposed such that a planar shape of the electrode body is in a "rectangular frame" shape. A region corresponding to the hole is welded on the exterior body to form the label on the welded region in the exterior body. However, creating a hole at the center of the electrode body reduces the surface areas of the positive electrode and the negative electrode, which contribute to the discharge performance of the power storage element. Accordingly, unless there is some reason which allows to sacrifice the discharge performance, such as strictly controlling the thickness of the central region by press-bonding the mutual laminated films at the central region as well, forming the engraved label at the peripheral edge region is realistic to ensure the extremely high reliability.

Obviously, the present invention is not limited to the lithium primary battery described as the working example but is applicable to various power storage elements (for example, a lithium secondary battery and an electric double layer capacitor) that include an exterior body formed of laminated films. Needless to say, the present invention can be applied to power storage elements having electrolytic solution impregnated in polymer such as in the case of polymer batteries. Further, the present invention can also be applied to power storage elements that do not use electrolytic solution itself such as in the case of all-solid-state batteries.

Figure 5:
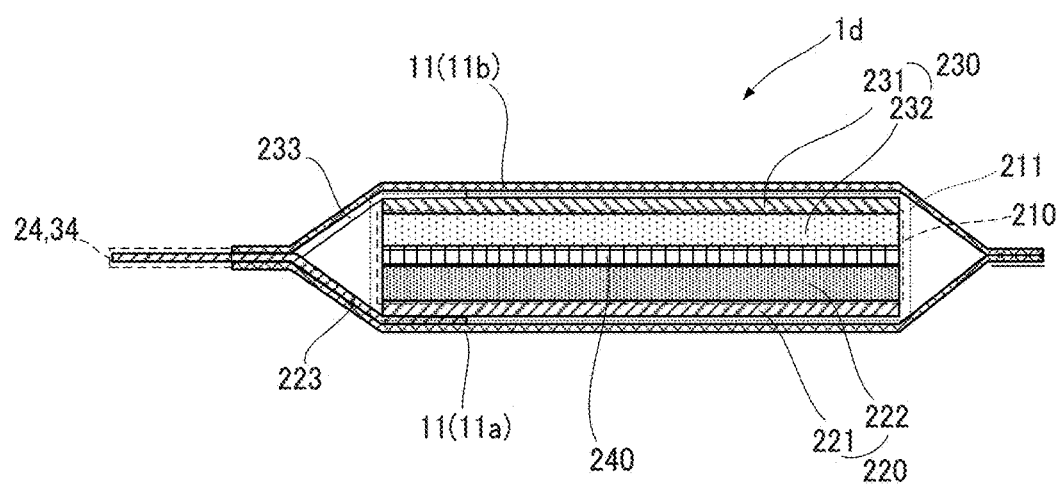
FIG. 5 is a drawing illustrating a structure of a laminate-type power storage element according to another working example of the present invention.

FIG. 5 illustrates an example of the laminate-type power storage element 1d using an all-solid-state battery 211. FIG. 5 corresponds to the cross section viewed from arrow a-a in FIG. 1A. As shown in the figure, the all-solid-state battery 211 housed in the exterior body 11 has a structure having formed to the top and the bottom surfaces of the laminated electrode body 210 current collectors (231, 221) made of metal foils. And the laminated electrode body 210 is made by sandwiching a sheet-type solid electrolyte (solid electrolyte layer) 240 between the sheet-shaped positive electrode (positive electrode layer) 220 and the sheet-shaped negative electrode (negative electrode layer) 230. The laminated electrode body 210 is an integrally formed sintered body. A method such as baking the formed body obtained by compressing powdered material using a mold (hereinafter also called compression molding method) and a method using a well-known green sheet (hereinafter called green sheet method) can be given as methods for manufacturing the laminated electrode body 210. The materials are filled in layers (sheet form) inside the mold with the compression molding method, and the materials are filled in the order of a powdery positive electrode layer material including a positive electrode active material and a solid electrolyte as the material of the positive electrode layer 220, powdery solid electrolyte as the material of the solid electrolyte layer 240, and a powdery negative electrode layer material including a negative electrode active material and a solid electrolyte as the material of the negative electrode layer 230. Subsequently, the body formed by compressing in the stacking direction the powdery material layers layered in sheet shapes is baked. Hereby, a laminated electrode body 210 of an integrally formed sintered body is manufactured.

The laminated electrode body 210 is manufactured by the green sheet method in the following manner. A slurry positive electrode layer material including a positive electrode active material and a solid electrolyte, a slurry negative electrode layer material including a negative electrode active material and a solid electrolyte, and a slurry solid electrolyte layer material including a solid electrolyte are respectively formed in a sheet-shaped green sheet. Then the green sheet made of solid electrolyte layer material is sandwiched by the positive electrode layer material and the negative electrode layer material to form a layered body which is baked for manufacturing the laminated electrode body 210. Thereafter, the all-solid-state battery 211 is completed by applying silver paste to the top and the bottom surfaces of the manufactured laminated electrode body 210 or forming the current collectors (221, 231) by such as gold evaporation. And the strip-shaped electrode terminal plates (223, 233) only need to be mounted to the current collectors (221, 231) with the electrode terminal plates (223, 233) guided outside of the exterior body 11 when the all-solid-state battery 211 is housed inside the exterior body 11 made of laminated films (11a, 11b).

What is claimed is:
1. A laminate-type power storage element, comprising:
an exterior body that is formed in a flat bag shape by welding a first laminated film and a second laminated film by thermocompression bonding; and
an electrode body that is sealed inside the exterior body, the electrode body having a sheet-shaped positive electrode and a sheet-shaped negative electrode, wherein
the first laminated film and the second laminated film each includes
a first resin layer that has a property of transmitting a laser beam,
a metal foil that is layered to the first resin layer, and
a second resin layer that is layered to the metal foil and has a thermal weldability,
the exterior body is configured such that the second resin layer of the first laminated film opposes the second resin layer of the second laminated film,
a label is formed in a surface of the metal foil facing the first resin layer of at least on of the first laminated film or the second laminated film by laser marking without altering the first resin layer of the first laminated film or the second laminated film by the laser beam, and the label is formed at a region where the first laminated film and the second laminated film are welded.

2. The laminate-type power storage element according to claim 1, wherein
the exterior body is configured by welding a plurality of peripheral edges of the first laminated film and the second laminated film and the label is formed on at least one of the plurality of peripheral edges.

3. The laminate-type power storage element according to claim 1, wherein
the laminate-type power storage element is incorporated into a card electronic device, the card electronic device being configured by pasting two resin films together with adhesive.

4. A card electronic device, comprising:
a second exterior body configured by pasting two resin films together with adhesive;
an electronic circuit incorporated in the second exterior body; and
a power supply incorporated in the second exterior body, wherein
a laminate-type power storage element according to claim 1 is used as the power supply.

* * * * *

UNITED STATES PATENT AND TRADEMARK OFFICE
CERTIFICATE OF CORRECTION

PATENT NO. : 10,483,557 B2
APPLICATION NO. : 15/406240
DATED : November 19, 2019
INVENTOR(S) : Nishimura et al.

Page 1 of 1

It is certified that error appears in the above-identified patent and that said Letters Patent is hereby corrected as shown below:

In the Claims

In Column 10, Line 64, delete "on" and insert --one-- therefore.

Signed and Sealed this
Eleventh Day of February, 2020

Andrei Iancu
*Director of the United States Patent and Trademark Office*